United States Patent
Kuo

(10) Patent No.: US 11,296,725 B2
(45) Date of Patent: *Apr. 5, 2022

(54) METHOD EMPLOYED IN LDPC DECODER AND THE DECODER

(71) Applicant: Silicon Motion, Inc., Hsinchu County (TW)

(72) Inventor: Shiuan-Hao Kuo, New Taipei (TW)

(73) Assignee: Silicon Motion, Inc., Hsinchu County (TW)

(*) Notice: Subject to any disclaimer, the term of this patent is extended or adjusted under 35 U.S.C. 154(b) by 330 days.

This patent is subject to a terminal disclaimer.

(21) Appl. No.: 16/726,808

(22) Filed: Dec. 24, 2019

(65) Prior Publication Data

US 2020/0136645 A1 Apr. 30, 2020

Related U.S. Application Data

(63) Continuation of application No. 15/820,391, filed on Nov. 21, 2017, now Pat. No. 10,523,236.

(51) Int. Cl.
*H03M 13/11* (2006.01)
*H03M 13/00* (2006.01)

(52) U.S. Cl.
CPC .... *H03M 13/1108* (2013.01); *H03M 13/1128* (2013.01); *H03M 13/616* (2013.01)

(58) Field of Classification Search
CPC ......... H03M 13/1108; H03M 13/1128; H03M 13/616
See application file for complete search history.

(56) References Cited

U.S. PATENT DOCUMENTS

| 8,677,225 | B1 | 3/2014 | Weiner |
| 8,996,972 | B1 | 3/2015 | Weiner |
| 2015/0180511 | A1 | 6/2015 | Ish-Shalom |
| 2017/0063400 | A1 | 3/2017 | Zhang |

FOREIGN PATENT DOCUMENTS

| CN | 106160752 A | 11/2016 |
| TW | 201735551 A | 10/2017 |
| TW | 201735552 A | 10/2017 |

*Primary Examiner* — April Y Blair
*Assistant Examiner* — Rong Tang
(74) *Attorney, Agent, or Firm* — Winston Hsu

(57) ABSTRACT

A method employed in a low-density parity-check code decoder includes: receiving a specific data portion of a first codeword; calculating a flipping function value of the specific data portion of the first codeword according to the specific data portion by using checking equations of a parity check matrix to calculate checking values of the specific data portion; and determining whether to flip the specific data portion of the first codeword by comparing the flipping function value with a flipping threshold which has been calculated based on a plurality of flipping function values of a plurality of previous data portions earlier than the specific data portion.

8 Claims, 4 Drawing Sheets

METHOD EMPLOYED IN LDPC DECODER AND THE DECODER

CROSS REFERENCE TO RELATED APPLICATIONS

This continuation application claims the benefits of U.S. application Ser. No. 15/820,391 filed on 2017 Nov. 21, which is entirely incorporated herein by reference.

BACKGROUND OF THE INVENTION

1. Field of the Invention

The invention relates to a decoding mechanism, and more particularly to a method employed in a low-density parity-check code (LDPC) decoder and the LDPC decoder.

2. Description of the Prior Art

Generally speaking, an LDPC decoder with a conventional bit flipping scheme is arranged to calculate all preliminary/initial syndromes of all data bits of a complete codeword, then determine a flipping threshold based on all the preliminary/initial syndromes, then respectively deciding whether to flip/toggle each bit of the complete codeword by comparing the calculated syndrome of the each bit with the flipping threshold, and calculating or updating the syndrome of each bit of the complete codeword if such bit has been flipped or toggled. This conventional bit flipping scheme inevitably needs complexity computation and leads to a slow convergence problem since it is necessary for the conventional scheme to calculate all preliminary/initial syndromes of all data bits of a complete codeword, then determining the flipping threshold based on all the preliminary/initial syndromes which have been calculated, and finally deciding whether to flip/toggle each bit of the complete codeword according to such flipping threshold and the calculated syndromes of all bits.

SUMMARY OF THE INVENTION

Therefore one of the objectives of the invention is to provide a method employed in a low-density parity-check code (LDPC) decoder and the LDPC decoder, to solve the above-mentioned problems.

According to embodiments of the invention, a method employed in a low-density parity-check code (LDPC) decoder is disclosed. The method comprises: receiving a specific data portion of a first codeword; calculating a flipping function value of the specific data portion of the first codeword according to the specific data portion by using checking equations of a parity check matrix to calculate checking values of the specific data portion; and determining whether to flip the specific data portion of the first codeword by comparing the flipping function value with a flipping threshold which has been calculated based on a plurality of flipping function values of a plurality of previous data portions earlier than the specific data portion.

According to the embodiments, an LDPC decoder is disclosed. The LDPC decoder comprises a barrel shifter, a syndrome calculator, an inverse barrel shifter, a flipping function value calculator, and a determining block. The barrel shifter is configured for shifting and rotating a first codeword by a specified number of bits. The syndrome calculator is coupled to the barrel shifter and configured for receiving an output of the barrel shifter to calculate a syndrome of a specific data portion of the first codeword based on checking equations of a parity check matrix. The inverse barrel shifter is coupled to the syndrome calculator and configured for performing an inverse operation of the barrel shifter upon an output of the syndrome calculator to generate a checking value of the specific data portion for a checking equation at a particular row of the parity check matrix. The flipping function value calculator is coupled to the inverse barrel shifter and configured for calculating a flipping function value of the specific data portion according to the specific data portion by using checking values which are generated from checking equations of the parity check matrix. The determining block is coupled to the flipping function value calculator and configured for determining whether to flip the specific data portion of the first codeword by comparing the flipping function value with a flipping threshold which has been calculated based on a plurality of flipping function values of a plurality of previous data portions earlier than the specific data portion.

According to the embodiments mentioned above, the method and decoder can significantly improve the performance of the decoder, reduce the complexity of computation, and speed up the convergence.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
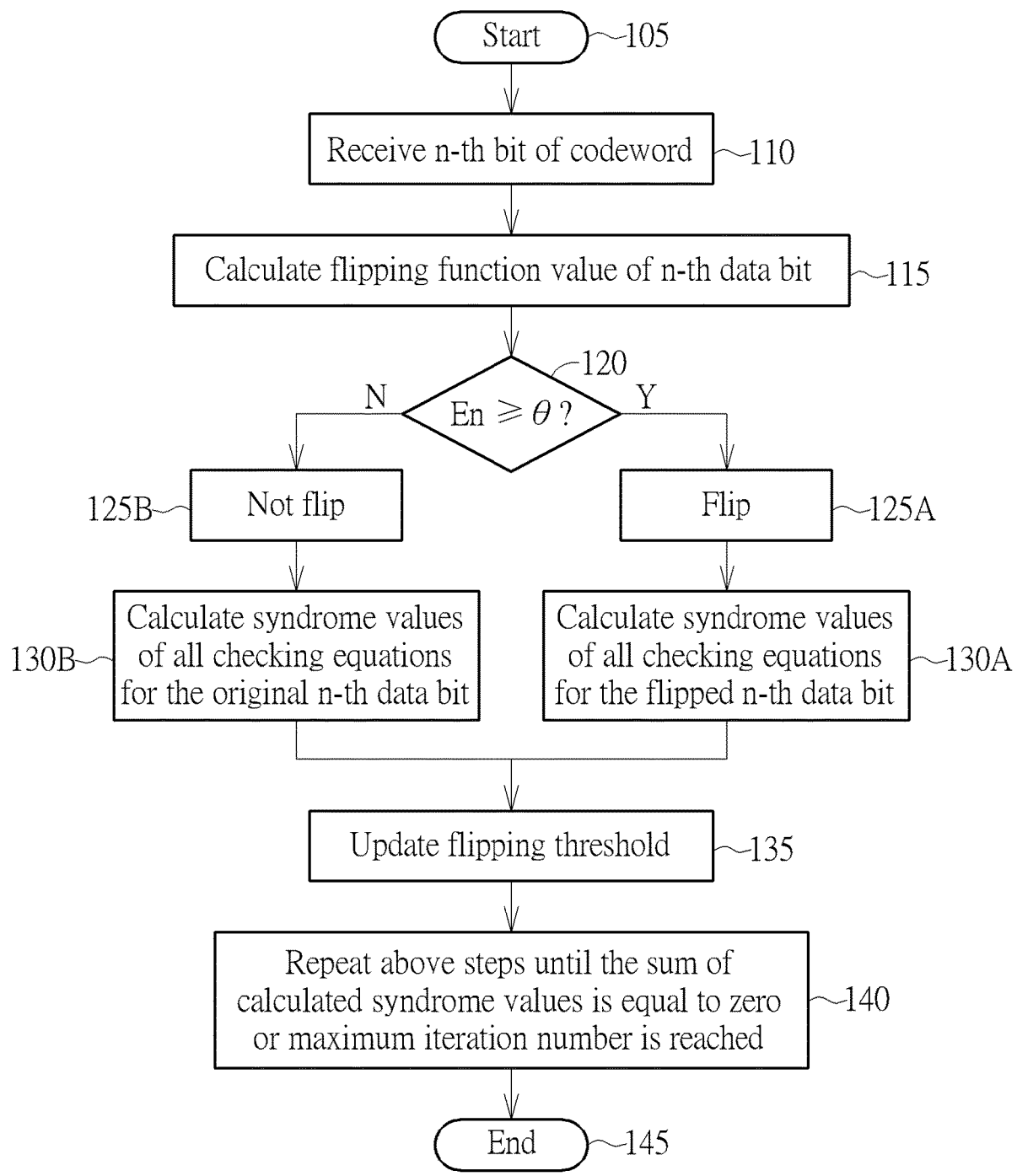
FIG. 1 is a diagram showing a flowchart of a decoding method employed in a linear block code decoder such as a low-density parity-check (LDPC) code decoder according to a first embodiment of the invention.

FIG. 1 is a diagram showing a flowchart of a decoding method employed in a linear block code decoder such as a low-density parity-check (LDPC) code decoder according to a first embodiment of the invention. Some data portions such as data bit(s) included in a codeword during transmission may be altered by some errors, and the decoding method is arranged to receive and decode such codeword to generate a correct codeword. The decoding method is arranged to perform a flipping operation which is used for determining whether to flip a data portion such as a bit (but not limited) of the received codeword and then calculate a corresponding syndrome after the flipping operation. If the calculated corresponding syndrome is equal to zero, the bit (flipped or not flipped) is estimated as a correct bit. That is, the decoding method correctly decodes this bit. The flipping operation is performed for each data portion such as each data bit of each codeword.

For a complete codeword, a conventional scheme is arranged for calculating all preliminary/initial syndromes of all data bits of such complete codeword, determining a flipping threshold based on all the preliminary/initial syndromes, deciding whether to flip a bit of the complete codeword by comparing a preliminary/initial syndrome of such bit with the flipping threshold for the bit, and finally calculating resultant/updated syndromes again after flipping operation. This, however, needs complexity computation.

To solve the problems of conventional scheme, in the first embodiment, the operation of determining whether to flip a bit in the embodiment is based on a flipping threshold which is determined according to the resultant/updated syndromes of previous data bits such as bits of a previous codeword after flipping operation. Thus, for determining whether to flip a bit of a current codeword, the decoding method does not require to wait until all preliminary syndromes of all data bits of such current codeword have been calculated. The decoding method can immediately determine whether to flip a bit once the preliminary syndrome of the bit has been calculated.

The decoding method more particularly relates to a column-layer bit flipping scheme which is capable of flipping a codeword bit without waiting until all preliminary syndromes of a completed codeword have been derived. That is, the decoding method can flip such codeword bit if necessary under a condition that other remaining codeword bit(s) of the same codeword has/have not been received/processed by the decoder. This can significantly improve the performance of the decoder, reduce the complexity of computation, and speed up the convergence.

That is, the decoding method is based on information of the codeword bit such as an incoming data bit and information of other data bits earlier than the incoming data bit. More specifically, the decoding method is arranged to estimate and update a flipping threshold for each data bit based on previous data bits when each data bit is being processed and then compare the estimated flipping threshold with a flipping function value of this currently incoming data bit to decide whether to flip this incoming data bit and calculate its updated syndrome. For example, the flipping function value can be configured as the preliminary syndrome of the data bit, i.e. invalid checksum.

In other embodiments of a weighted bit flipping decoder, the decoding method can be further arranged to determine weighted values based on information of the previous data bits to determine flipping function values and flipping threshold.

Provided that substantially the same result is achieved, the steps of the flowchart shown in FIG. 1 need not be in the exact order shown and need not be contiguous, that is, other steps can be intermediate. Steps are detailed in the following:

Step 105: Start;

Step 110: Receive a specific data bit of a codeword having N bits wherein N is a positive integer; for example, the specific data bit is an incoming bit, e.g. the n-th bit of the codeword;

Step 115: Calculate the flipping function value En of the n-th data bit, for example, the flipping function value En can be the invalid checksum (i.e. the syndrome, the sum of preliminary checking values associated with all checking equations of parity check matrix H) of the specific data bit;

Step 120: Compare the flipping function value En of the n-th data bit with the flipping threshold θ of n-th data bit to decide whether to flip the n-th data bit wherein the flipping threshold θ of n-th data bit has calculated or determined according to the flipping function values of (N−1) previous data bits;

Step 125A: Flip the n-th data bit;

Step 125B: Not flip the n-th data bit;

Step 130A: Calculate the syndrome/checking values of all checking equations for the n-th data bit which has been flipped;

Step 130A: Calculate the syndrome/checking values of all checking equations for the n-th data bit which is not flipped;

Step 135: Update the flipping threshold θ for next data bit (s) according to the flipping function value En of the n-th data bit and flipping function values of the (N−1) previous data bits;

Step 140: Repeat the above steps for next data bit(s) until the sum of calculated syndrome/checking values is equal to zero or a maximum iteration number is reached; and Step 145: End.

Particularly, the decoding method is based on a parity check matrix H to calculate syndrome/checking values of received data bits. For any (row) vector X, $S=X^T \cdot H$ is called the syndrome of X. The vector X indicates a received codeword which is a correct codeword if and only if S=0. The matrix H has M rows and N columns wherein M and N are positive integers. In the embodiments, N means that a codeword is defined to have N data bits, and M means M checking equations or checking nodes. In the embodiments, the parity check matrix H is associated with a quasi-cyclic (QC) code and formed by multiple blocks of circulant matrices. The LDPC decoder is a QCLDPC decoder. Each element of codeword vector X is either 0 or 1. Smn denotes the syndrome/checking value of the n-th data bit at the n-th column for a particular checking equation at m-th row, and $\Sigma_m$Smn denotes the summation of syndrome/checking values of the n-th data bit at the n-th column for all M checking equations, i.e. the invalid checksum of the n-th data bit. For example, if one checking equation is not satisfied, the invalid checksum is equal to one; similarly, if two checking equations are not satisfied, the invalid checksum is equal to two.

In Step 115, the decoding method configures the flipping function value En of the n-th data bit as the invalid checksum of the n-th data bit, i.e. the preliminary syndrome before flipping operation. Identically, the decoding method can perform similar steps for (N−1) previous data bits to respectively calculate the flipping function values of (N−1) previous data bits before processing the n-th data bit.

Thus, in Step 120, the decoding method is arranged to compare the flipping function value En with the flipping threshold θ wherein the flipping threshold θ has been determined or updated based on the flipping function values of (N−1) previous data bits in which some data bits may belong to another different codeword. For example, the decoding method can sort the flipping function values of (N−1) previous data bits, select and record the maximum one among the flipping function values of (N−1) previous data bits as the flipping threshold θ, and can also record the second maximum value among the above flipping function values as a candidate flipping threshold for the n-th data bit. If the flipping function value En is not smaller than the flipping threshold θ, the decoding method is arranged to flip or toggle the n-th data bit in Step 125A, and in Step 130A the decoding method is arranged to calculate $\Sigma_m$ Smn=En, i.e. the sum of syndrome/checking values of all checking equations for the n-th data bit which has been flipped. If the flipping function value En is smaller than the flipping threshold θ, the decoding method is arranged to not to flip or toggle the n-th data bit in Step 125B, and in Step 130B the decoding method is arranged to calculate $\Sigma_m$Smn=En, i.e. the sum of syndrome/checking values of all checking equations for the n-th data bit which is not flipped.

In Step 135, the decoding method then is arranged to update the flipping threshold θ for one or more next data bit (s) according to the flipping function value En and flipping function values of the (N−1) previous data bits. Similarly, the decoding method can sort the flipping function value En and the flipping function values of (N−2) previous data bits, select and update/record the maximum one among the flipping function value En and flipping function values of (N−2) previous data bits as the flipping threshold θ, and can also update/record the second maximum value among the above flipping function values as a candidate flipping threshold for the next data bit (s).

Accordingly, the flipping threshold θ for each data portion such as each data bit is determined based on the invalid checksums of (N−1) previous data bits. It should be noted that the decoding method can also record the corresponding index of the flipping threshold θ corresponding to the maximum flipping function value and the corresponding index of candidate threshold corresponding the second maximum flipping function value, so as to update the thresholds. However, this is not meant to be a limitation.

Figure 2:
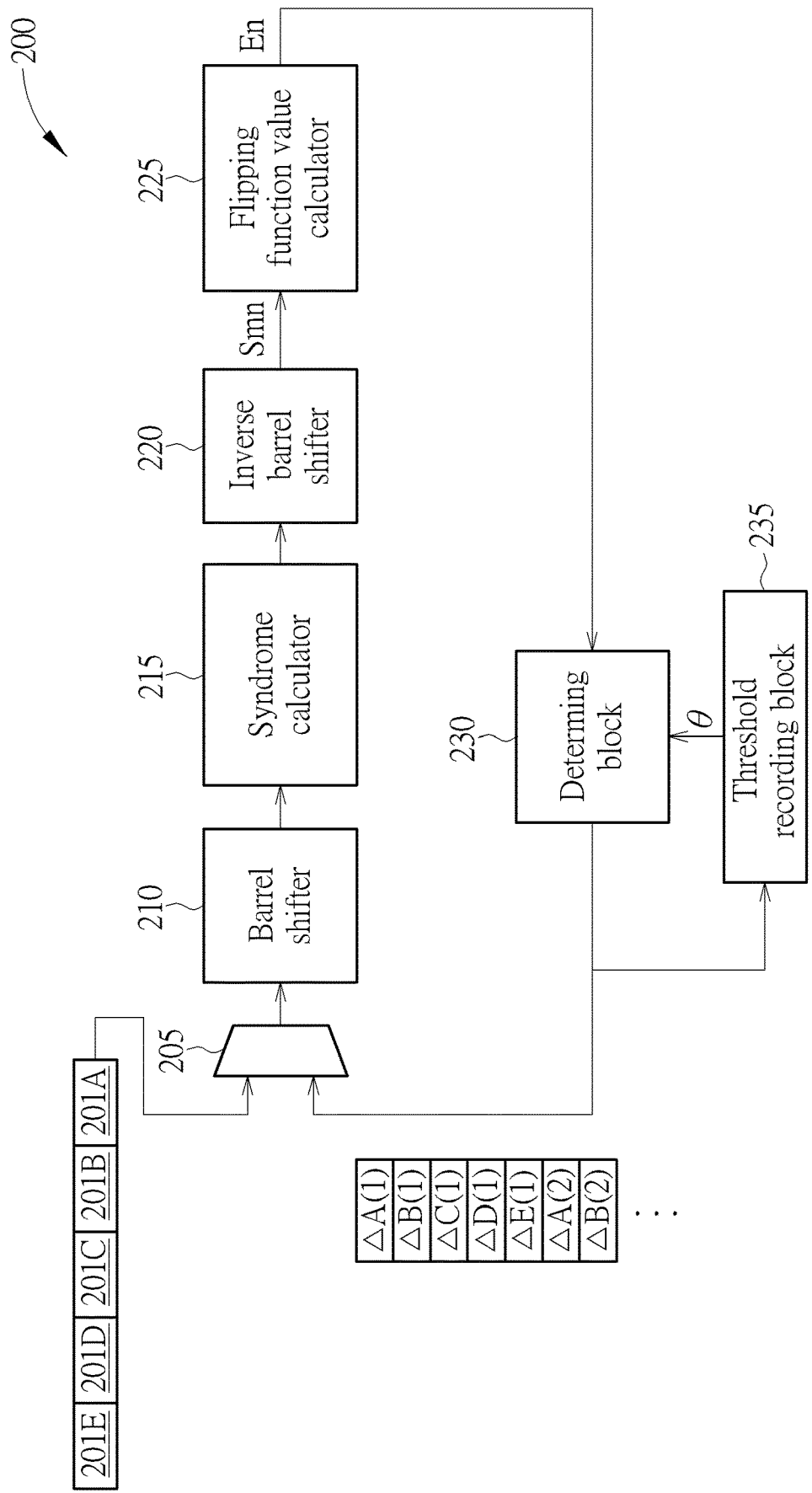
FIG. 2 is a block diagram of a decoder circuit according to the embodiment of FIG. 1.

For implementation, please refer to FIG. 1 in conjunction with FIG. 2. FIG. 2 is a block diagram of a decoder circuit 200 according to the embodiment of FIG. 1. The decoder circuit 200 comprises an exclusive-OR (XOR) circuit 205, a barrel shifter 210, a syndrome calculator 215, an inverse barrel shifter 220, a flipping function value calculator 225, a determining block 230, and a threshold recording block 235. The XOR circuit 205 is arranged to receive codewords such as codewords 201A, 201B, 201C, 201D, and 201E at its first input and receive feedback bits at its second input to perform XOR operation to generate an output for the barrel shifter 210. The barrel shifter 210 is a digital circuit which is coupled to the output of XOR circuit 205 and arranged to shift and rotate a codeword by a specified number of bits. The syndrome calculator 215 is coupled to the barrel shifter 210 and arranged to receive the output of barrel shifter 210 to calculate syndrome(s) of a data portion such a data bit (e.g. the n-th data bit of the codeword) based on checking equations of the parity check matrix H. in the embodiment, the syndrome of a data portion is defined as a sum of checking/syndrome values of such data portion for all checking equations of the parity check matrix H; however, this is not meant to be a limitation. The inverse barrel shifter 220 is coupled to the syndrome calculator 215 and arranged to receive the output of syndrome calculator 215 to perform the inverse operation of barrel shifter 210 to generate a checking value Smn of the n-th data bit at its output for a checking equation at the m-th row of parity check matrix H; the checking value Smn may also be referred to as a syndrome value of n-th data bit for the checking equation at the m-th row. The inverse barrel shifter 220 is arranged to output the syndrome/checking values S1n, S2n, . . . , and SMn of the n-th data bit at its output one by one for all checking equations of parity check matrix H. The flipping function value calculator 225 is coupled to the inverse barrel shifter 220 and arranged to calculate or derive the flipping function value En of the n-th data bit based on the checking values S1n, S2n, . . . , and SMn of the n-th data bit corresponding to all checking equations of parity check matrix H. For example, the flipping function value calculator 225 calculates the flipping function value $En=\Sigma_m Smn$, i.e. the sum of syndrome/checking values of the n-th data bit for all checking equations. This is not meant to be a limitation; in other embodiments, the flipping function value En can be configured or calculated by other different formulas.

The determining block 230 is coupled to the output of flipping function value calculator 225 and is arranged to compare the flipping function value En of the n-th data bit with the flipping threshold θ to decide whether to flip the n-th data bit. The threshold recording block 235 is coupled to the determining block 230 and arranged for recoding the above-mentioned flipping threshold θ and the candidate flipping threshold (i.e. the second maximum of the invalid checksums of (N−1) previous data bits). The determining block 230 is arranged to update the flipping threshold θ. The determining block 230 then outputs the feedback bit (if flipped or not flipped) to the XOR circuit 205. ΔA(1), ΔB(1), ΔC(1), ΔD(1), ΔE(1), ΔA(2), ΔB(2), and so on respectively mean different feedback bits of different codewords. The barrel shifter 210, syndrome calculator 215, inverse barrel shifter 220, flipping function value calculator 225, determining block 230, and threshold recording block 235 are respectively arranged to perform corresponding operations upon the next data bit such as (n+1)-th data bit.

Figure 3:
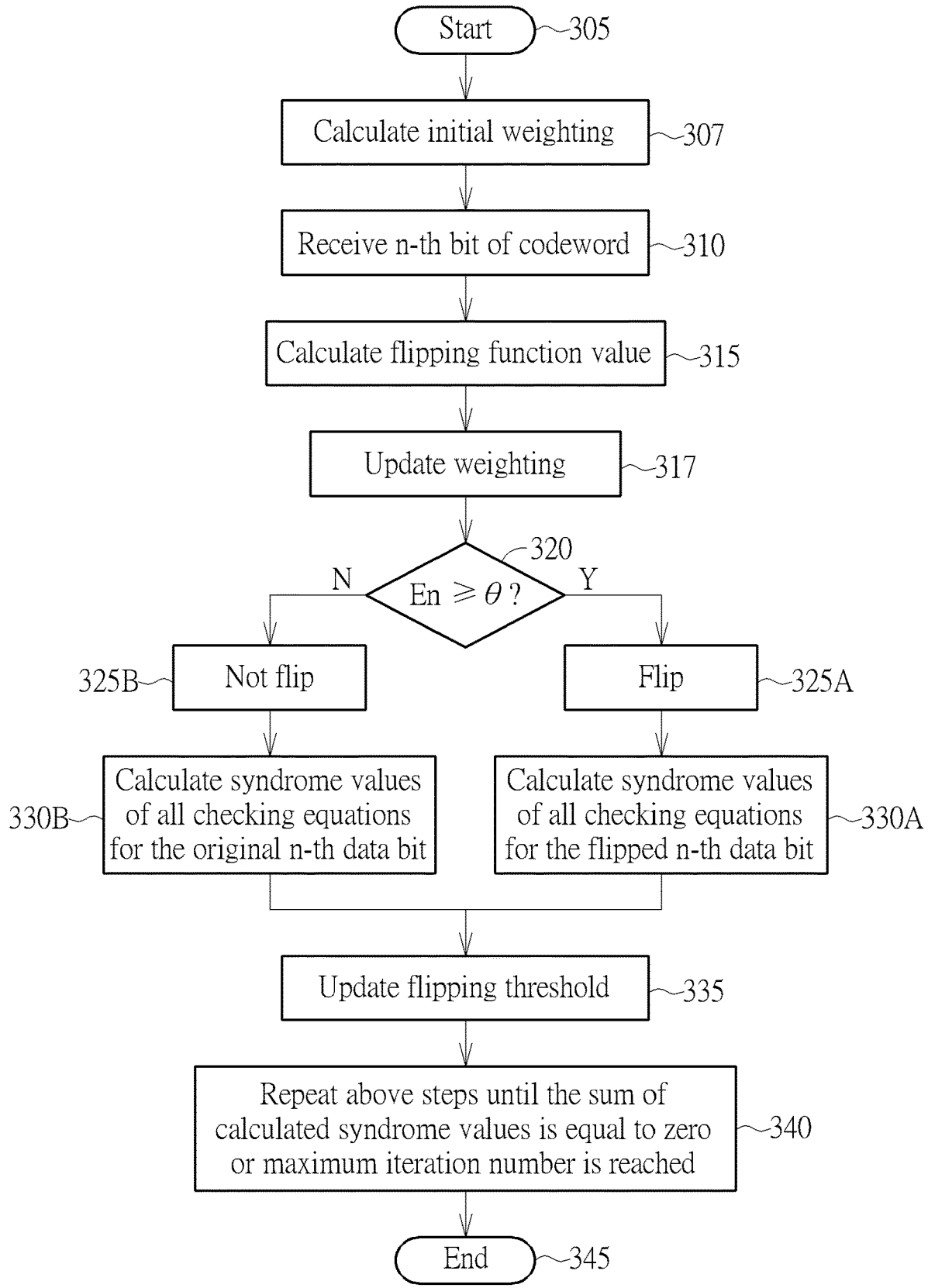
FIG. 3 is a diagram showing a flowchart of a decoding method employed in a WBF LDPC decoder according to a second embodiment of the invention.
Figure 4:
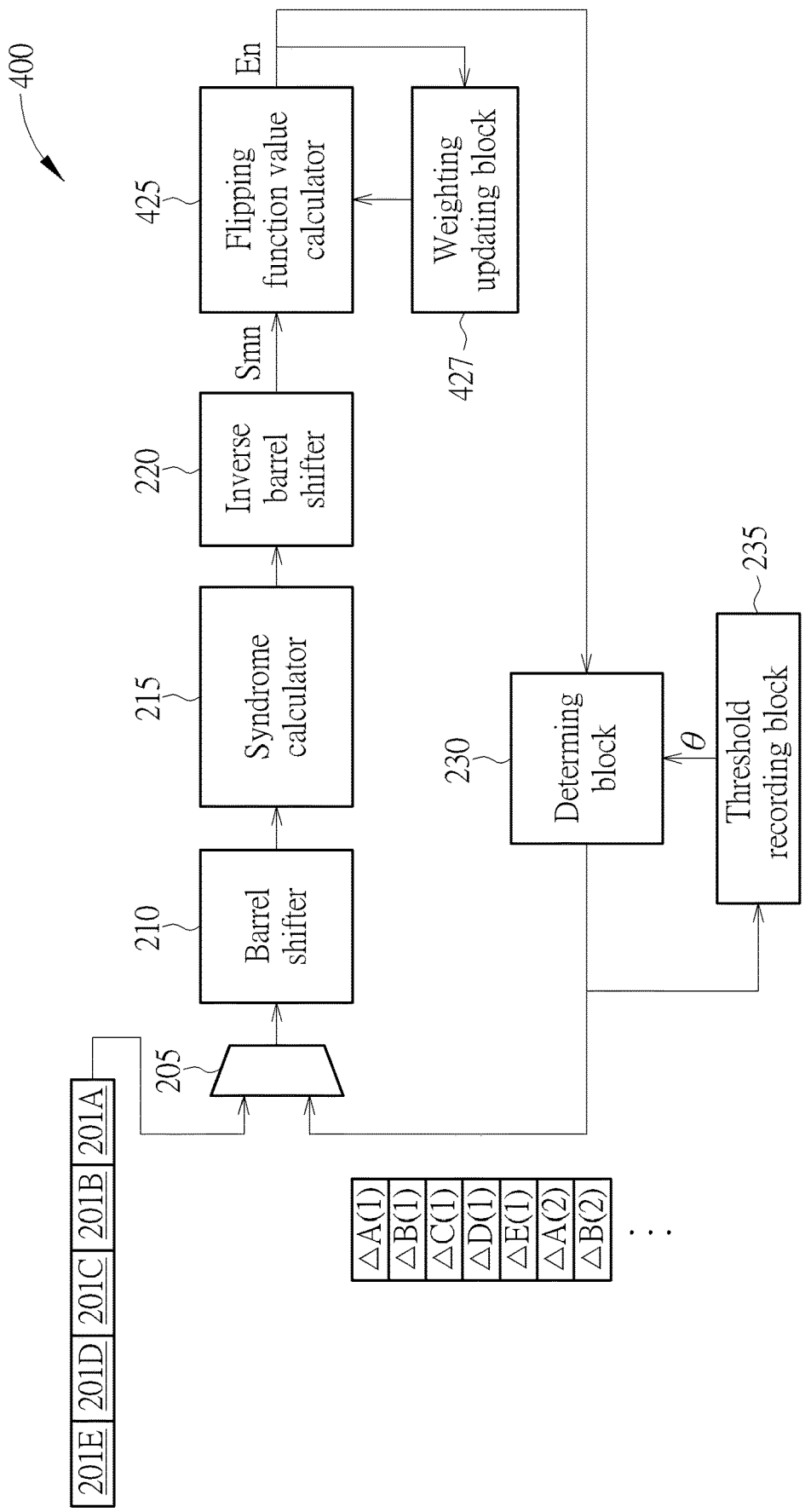
FIG. 4 is a block diagram of a WBF LDPC decoder circuit according to the embodiment of FIG. 3.

Further, the decoding method mentioned above can be also applied to a weighted bit flipping (WBF) decoder circuit. Please refer to FIG. 3 in conjunction with FIG. 4. FIG. 3 is a diagram showing a flowchart of a decoding method employed in a WBF LDPC decoder according to a second embodiment of the invention. FIG. 4 is a block diagram of a WBF LDPC decoder circuit 400 according to the embodiment of FIG. 3. In the embodiment, the method employed in the WBF decoder circuit 400 can be further arranged to determine weighted values based on information of syndrome/checking values of the previous data bits to determine flipping function values and flipping threshold.

Provided that substantially the same result is achieved, the steps of the flowchart shown in FIG. 3 need not be in the exact order shown and need not be contiguous, that is, other steps can be intermediate. Steps are detailed in the following:

Step 305: Start;
Step 307: Calculate initial weighting;
Step 310: Receive a specific data bit of a codeword having N bits wherein N is a positive integer; for example, the specific data bit is an incoming bit, e.g. the n-th bit of the codeword;
Step 315: Calculate the flipping function value En of the n-th data bit;
Step 317: Update the weighting;
Step 320: Compare the flipping function value En of the n-th data bit with the flipping threshold θ of n-th data bit to decide whether to flip the n-th data bit wherein the flipping threshold θ of n-th data bit has calculated or determined according to the flipping function values of (N−1) previous data bits;
Step 325A: Flip the n-th data bit;
Step 325B: Not flip the n-th data bit;
Step 330A: Calculate the syndrome/checking values of all checking equations for the n-th data bit which has been flipped;
Step 330B: Calculate the syndrome/checking values of all checking equations for the n-th data bit which is not flipped;
Step 335: Update the flipping threshold θ for next data bit(s) according to the flipping function value En of the n-th data bit and flipping function values of the (N−1) previous data bits;
Step 340: Repeat the above steps for next data bit(s) iteratively until the sum of calculated syndrome/checking values is equal to zero or a maximum iteration number is reached; and
Step 345: End.

In Step 307, the initial weighting such as an initial weighted value can be configured as zero if the WBF LDPC decoder 400 is with a dynamic weighted bit flipping algorithm or calculated according to the channel value if the WBF LDPC decoder 400 is with other weighted bit flipping algorithms.

In Step 315, for example, the decoding method is arranged to calculate the flipping function value En of the n-th data bit based on the following equation:

$$En = \sum_m \omega_{mn} \times (1 - 2 \times Sm)$$

wherein $\omega_{mn}$ denotes a weighted value for the n-th data bit corresponding to the checking equation at the m-th row of parity check matrix H. That is, there are M×N weighted values in which some are identical while others are different. $\omega_{mn}$ can be represented by the following equation:

$$\omega_{mn} = \min_n \max(-En, 0)$$

In other embodiment, the flipping function value En of the n-th data bit can be also designed as the following equation (but not limited):

$$En = \sum_m \omega_{mn} \times (2 \times Sm - 1)$$

In Step 317, the decoding method is arranged to calculate the weighted values $\omega_{mn}$ for each of (N−1) previous data bits, and sort the weighted values to select and record the minimum weighted value, the second minimum weighted value, and the third weighted value each time when calculating the flipping function value such as En of the n-th data bit. If a new weighted value has been calculated based on the flipping function value according to the above equation, the decoding method is arranged to sort and record the minimum weighted value, the second minimum weighted value, and the third weighted value. Also, the decoding method can be arranged to record corresponding indexes associated with the minimum weighted value, the second minimum weighted value, and the third weighted value.

Also, the decoding method is arranged to configure the maximum one among the flipping function values of (N−1) previous data bits as the flipping threshold θ.

The operations of Step 320 to Step 340 are similar to corresponding Steps mentioned in FIG. 1, and are not detailed for brevity.

For implementation, the decoder circuit 400 comprises the XOR circuit 205, barrel shifter 210, syndrome calculator 215, inverse barrel shifter 220, a flipping function value calculator 425, a weighting updating block 427, the determining block 230, and the threshold recording block 235. The XOR circuit 205 is arranged to receive codewords such as codewords 201A, 201B, 201C, 201D, and 201E at its first input and receive feedback bits at its second input to perform XOR operation to generate an output for the barrel shifter 210. The barrel shifter 210 is a digital circuit which is couple to the output of XOR circuit 205 and arranged to shift and rotate a codeword by a specified number of bits. The syndrome calculator 215 is coupled to the barrel shifter 210 and arranged to receive the output of barrel shifter 210 to calculate the syndrome (s) of a data portion such a data bit (e.g. the n-th data bit of the codeword) based on checking equations. The inverse barrel shifter 220 is coupled to the syndrome calculator 215 and arranged to receive the output of syndrome calculator 215 to perform the inverse operation of barrel shifter 210 to generate the syndrome/checking value Smn of the n-th data bit at its output for a checking equation at the m-th row of parity check matrix H. The inverse barrel shifter 220 is arranged to output the syndrome/checking values S1n, S2n, ..., and SMn of the n-th data bit at its output one by one for all checking equations of parity check matrix H.

The flipping function value calculator 425 is coupled to the inverse barrel shifter 220 and arranged to calculate or derive the flipping function value En of the n-th data bit based on the values S1n, S2n, ..., and SMn of the n-th data bit corresponding to all checking equations of parity check matrix H. For example, the flipping function value calculator 225 calculates the flipping function value $En = \sum_m \omega_{mn} \times (1 - 2 \times Sm)$. This is not meant to be a limitation; in other embodiments, the flipping function value En can be configured or calculated by other different formulas.

The weighting updating block 427 is coupled to the flipping function value calculator 425 and arranged to calculate the weighted values $\omega_{mn}$ for each of (N−1) previous data bits before processing the n-th data bit, and sort the weighted values to select and recode the minimum weighted value, the second minimum weighted value, and the third weighted value each time when calculating the flipping function value such as En of the n-th data bit. If a new weighted value has been calculated based on the flipping function value according to the above equation, the weighting updating block 427 is arranged to sort and record the minimum weighted value, the second minimum weighted value, and the third weighted value. Also, the weighting updating block 427 can be arranged to record corresponding indexes associated with the minimum weighted value, the second minimum weighted value, and the third weighted value.

The determining block 230 is coupled to the output of flipping function value calculator 425 and is arranged to compare the flipping function value En of the n-th data bit with the flipping threshold θ to decide whether to flip the n-th data bit. The threshold recording block 235 is coupled to the determining block 230 and arranged for recoding the above-mentioned flipping threshold θ and the candidate flipping threshold (i.e. the second maximum of flipping function values of (N−1) previous data bits). The determining block 230 is arranged to update the flipping threshold θ. The determining block 230 then outputs the feedback bit (if flipped or not flipped) to the XOR circuit 205. ΔA(1), ΔB(1), ΔC(1), ΔD(1), ΔE(1), ΔA(2), ΔB(2), and so on respectively mean different feedback bits of different codewords. The barrel shifter 210, syndrome calculator 215, inverse barrel shifter 220, flipping function value calculator 425, weighting updating block 427, determining block 230, and threshold recording block 235 are respectively arranged to perform corresponding operations upon the next data bit such as (n+1)-th data bit.

In addition, it should be noted that the above-mentioned elements and/or blocks included within a decoder circuit can be implemented by hardware circuits such as processors, software modules/application/programs, and/or any combinations of hardware circuits and software modules/application/programs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An LDPC decoder, comprising:
    a barrel shifter, configured for shifting and rotating a first codeword by a specified number of bits;
    a syndrome calculator, coupled to the barrel shifter, configured for receiving an output of the barrel shifter to calculate a syndrome of a specific data portion of the first codeword based on checking equations of a parity check matrix;
    an inverse barrel shifter, coupled to the syndrome calculator, configured for performing an inverse operation of the barrel shifter upon an output of the syndrome calculator to generate a checking value of the specific data portion for a checking equation at a particular row of the parity check matrix;
    a flipping function value calculator, coupled to the inverse barrel shifter, configured for calculating a flipping function value of the specific data portion according to the specific data portion by using checking values which are generated from checking equations of the parity check matrix; and
    a determining block, coupled to the flipping function value calculator, configured for determining whether to flip the specific data portion of the first codeword by comparing the flipping function value with a flipping threshold which has been calculated based on a plurality of flipping function values of a plurality of previous data portions earlier than the specific data portion;
    wherein a data length of the specific data portion is less than a data length of a complete codeword, and a data length of the plurality of previous data portions is less than the data length of the complete codeword; at least one of the plurality of previous data portions is compromised by a second codeword which is followed by the first codeword.

2. The LDPC decoder of claim 1, wherein the barrel shifter is arranged for receiving at least one next data portion, and the barrel shifter, the syndrome calculator, the inverse barrel shifter, the flipping function value calculator, and the determining block iteratively repeat corresponding operations for the at least one next data portion until the syndrome after calculated again is equal to zero or a maximum iteration number is reached.

3. The LDPC decoder of claim 2, wherein the syndrome is configured as a sum of the checking values after calculated again.

4. The LDPC decoder of claim 1, wherein the specific data portion is a data bit of the first codeword.

5. The LDPC decoder of claim 1, wherein the flipping function value calculator is arranged for:
    calculating the checking values of the specific data portion by using the checking equations of the parity check matrix and a plurality of weighted values which has been determined based on at least minimum value selected from multiple weighted values of the plurality of previous data portions; and
    calculating the flipping function value of the specific data portion of the first codeword according to the calculated checking equations.

6. The LDPC decoder of claim 5, further comprising:
    a weighting updating block, coupled to the flipping function value calculator, configured for updating the plurality of weighted values according to the calculated flipping function value of the specific data portion before the determining block determines whether to flip the specific data portion of the first codeword.

7. The LDPC decoder of claim 1, further comprising:
    a threshold recording block, coupled to the determining block, configured for updating the flipping threshold and a corresponding index for a next data portion according to the calculated flipping function value of the specific data portion.

8. The LDPC decoder of claim 1, wherein the determining block is arranged for flipping or toggling the specific data portion of the first codeword when the flipping function value is not smaller than the flipping threshold which has been calculated based on the plurality of flipping function values of the plurality of previous data portions earlier than the specific data portion.

* * * * *